United States Patent
D'Souza et al.

(10) Patent No.: US 7,472,033 B1
(45) Date of Patent: Dec. 30, 2008

(54) APPARATUS FOR CONTROLLING SEMICONDUCTOR CHIP CHARACTERISTICS

(75) Inventors: Godfrey P. D'Souza, San Jose, CA (US); Keith Klayman, Sunnyvale, CA (US)

(73) Assignee: Transmeta Corporation, Santa Clara, CA (US)

( * ) Notice: Subject to any disclaimer, the term of this patent is extended or adjusted under 35 U.S.C. 154(b) by 426 days.

(21) Appl. No.: 10/273,681

(22) Filed: Oct. 17, 2002

Related U.S. Application Data

(63) Continuation of application No. 09/595,196, filed on Sep. 16, 2000, now abandoned.

(51) Int. Cl.
*G06F 11/30* (2006.01)
*G06F 9/00* (2006.01)

(52) U.S. Cl. .................. 702/117; 702/118; 702/124; 702/182; 702/189

(58) Field of Classification Search ......... 702/117–120, 702/57–59, 108, 122–126, 182–186, 188, 702/189; 324/73.1, 765; 714/30, 47, 49, 714/726, 733, 734; 713/322, 324, 320, 401; 327/276, 277, 284; 326/93, 62, 63, 9, 37, 326/38, 80, 99, 104, 31
See application file for complete search history.

(56) References Cited

U.S. PATENT DOCUMENTS

| | | | | |
|---|---|---|---|---|
| 5,180,937 A | * | 1/1993 | Laird et al. | 327/276 |
| 5,337,254 A | * | 8/1994 | Knee et al. | 716/1 |
| 5,719,800 A | * | 2/1998 | Mittal et al. | 713/321 |
| 5,768,593 A | | 6/1998 | Walters et al. | |
| 5,809,522 A | | 9/1998 | Novak et al. | |
| 5,940,785 A | * | 8/1999 | Georgiou et al. | 702/132 |
| 5,974,476 A | * | 10/1999 | Lin et al. | 710/14 |
| 6,081,462 A | * | 6/2000 | Lee | 365/194 |
| 6,212,482 B1 | * | 4/2001 | Manning | 702/182 |
| 6,219,813 B1 | * | 4/2001 | Bishop et al. | 714/736 |
| 6,298,411 B1 | | 10/2001 | Giacalone | |
| 6,356,122 B2 | * | 3/2002 | Sevalia et al. | 327/105 |
| 6,430,674 B1 | | 8/2002 | Trivedi et al. | |
| 6,470,492 B2 | | 10/2002 | Bala et al. | |
| 6,725,391 B2 | * | 4/2004 | Swoboda | 713/500 |
| 6,754,599 B2 | * | 6/2004 | Swoboda et al. | 702/79 |
| 2002/0008591 A1 | * | 1/2002 | Swoboda | 331/57 |
| 2002/0116650 A1 | * | 8/2002 | Halepete et al. | 713/300 |

OTHER PUBLICATIONS

IBM, "Circuitry and Method for Evaluating the Speed of ASIC Semiconductor Device Circuitry", Feb. 1, 2000, IBM technical disclosure bulletin, issue No. 430, p. 403.*

Sjogren et al., "Interfacing Synchronous and Asynchronous Modules Within a High-speed Pipeline", Sep. 15-16, 1997, IEEE, Proceedings, Seventeenth Conference on Advanced Research in VLSI, 1997, pp. 47-61.*

* cited by examiner

*Primary Examiner*—Hal D Wachsman

(57) ABSTRACT

Apparatus including functional components of circuitry defined on a semiconductor chip, the functional components including a component having modifiable operating characteristics, a performance measuring circuit providing an output indicative of operating characteristics of the circuitry defined on the semiconductor chip during operation of the circuitry, and computer implemented software means for controlling a value for an operating characteristic of the component having modifiable operating characteristics in response to the output provided by the performance measuring circuit.

8 Claims, 3 Drawing Sheets

APPARATUS FOR CONTROLLING SEMICONDUCTOR CHIP CHARACTERISTICS

This application is a continuation of Ser. No. 09/595,196, filed Sep. 16, 2000 now abandoned, entitled, APPARATUS FOR CONTROLLING SEMICONDUCTOR CHIP CHARACTERISTICS" by Godfrey P. D'Souza et al., and assigned to the assignee of the present invention.

BACKGROUND OF THE INVENTION

1. Field of the Invention

This invention relates to computer systems and, more particularly, to an arrangement for varying semiconductor chip characteristics based on attributes determined by monitoring the chip in operation.

2. History of the Prior Art

A modern computer is typically constructed from a plurality of modular semiconductor chip components connected together in circuit by means such as conductive traces arranged on a circuit board. For example, a computer may include a modular microprocessor chip, a plurality of memory chips, various input/output devices each including chips providing electronic circuitry for controlling the device, and other circuitry joined together to provide a system for manipulating data in response to instructions.

In order to assure that the circuit elements of each of the chips function together to provide a system which correctly manipulates data, each of the different chips includes interface circuitry adapted to correctly handle and interpret signals received from and sent to circuit elements on the other chips of the system. For example, memory circuits are designed to respond to signals provided at particular voltage and current levels which appear at particular input terminals at particular times with respect to other signals. In order to cause the memory circuits to respond correctly, the signals must fall within the expected ranges and must appear at the correct times with respect to other signals.

Chip manufacturers provide specifications which define the signals with which circuits on their chips will function correctly. Among these specifications are characteristics called "output valid time" and "output hold time." As is illustrated in FIG. 1, output valid time measures the period after a clock signal before valid data is guaranteed at a terminal; data received before this period has ended may not be properly processed by the chip. Output hold time measures a period after a next clock signal during which data is guaranteed to remain valid. In order to function properly with signals received from circuitry on another chip, the output circuitry of the other chip must provide signals meeting these and other specifications.

A chip designer can assure that a chip will meet the design specifications for an interface with another chip only by providing output (and input) characteristics which meet the specifications of the other chip. Thus, a chip designer must assure that the output data it produces for another chip comply with, among other things, the input setup and input hold times specified for that other chip. The designer must assure that the delays provided in the data output paths comply with the specifications for the other chip.

If a chip is to interface with a number of different chips serving the same purpose (e.g., memory chips from different manufacturers), then the chip must meet the specifications of all of the different chips. Often these specifications vary sufficiently that reaching this result is quite difficult.

For example, the propagation characteristics of signals provided by a particular chip depend upon a number of factors including the particular process used in the manufacture of the chip, the voltage of operation, and the temperature of operation. As these factors vary during operation, so do the propagation characteristics of the chip and its ability to meet the specifications required by the various interfaces with other chips.

In order to assure that their chips are able to meet the specifications of a variety of other chips, prior art designers have provided a number of different solutions. One technique which has been utilized selects from among a plurality of output paths having different delay characteristics measured in hardware during operation.

The ability to meet interface specifications is made even more difficult as computer systems become more advanced. For example, each step in the constant increase in system clock frequencies utilized by computers makes it more difficult to meet both the output valid time and the output hold time specifications of an interface. Although it becomes easier to assure that valid data reaches another chip by the specified time as silicon speed rises, it becomes more difficult to guarantee that the data will remain for a specified hold time. It has become necessary in many cases to provide latching circuitry to meet specified hold times. However, when a chip is to operate with other chips having different characteristics, the need to provide circuitry to meet the specifications of each of the different chips becomes overwhelmingly complicated.

To meet this problem, an advanced arrangement, described in U.S. Pat. No. 5,180,937, entitled Delay Compensator and Monitor Circuit Having Timing generator and Sequencer, Laird, et al., issued Jan. 19, 1993 includes a plurality of delay lines that are monitored during operation of circuitry on a chip to provide an output indicative of the operating speed of the chip. More particularly, the different delay lines provide output signals which are longer than, near to, or shorter than a measurement period. These outputs are utilized by a timing synchronizer circuit (a state machine) to determine whether the circuitry on the chip is running at a fast or slow rate. The result provided by the timing synchronizer circuit (a state machine) to determine whether the circuitry on the chip is running at a fast or slow rate. The result provided by the timing synchronizer circuitry is then used to the delay which is selected for an output circuit in order to match the specifications for output valid time and output hold time required by interfaces to other chips during the operation of the chip being controlled. In one embodiment, the timing synchronizer selects a delay line to be inserted in a path controlling the timing for a latch in the output path based on the results obtained through the controlled measurements of the output of the monitoring delay lines.

The circuitry described in this patent helps significantly to increase the ability of semiconductor chips to meet specifications for interfaces with other chips. However, it is quite difficult to provide the ability for such circuitry to manipulate circuitry characteristics over more than limited ranges of operating conditions without the cost becoming too great and the circuitry too large.

Moreover, an even more difficult problem has been raised by a recent advance in the computer art. A new microprocessor has been developed which combines a simple but fast host processor (called a "morph host") and software (called "code morphing software") to execute application programs designed for a processor having a different instruction set at a rate equivalent to the processor for which the programs were designed (the target processor). The morph host processor executes the code morphing software to translate the target application programs into morph host processor instructions which accomplish the purpose of the original target software. As the target instructions are translated, they are stored in a translation buffer where they may be accessed without further translation. The resulting translations are then executed and perform the same functions that they would on a processor that implemented the target architecture in hardware. Although the initial translation and execution of a program may be slow, once translated, many of the steps normally required to execute a program in hardware are eliminated. The new processor is described in detail in U.S. Pat. No. 6,031,992, entitled Combining Hardware And Software To Provide An Improved Microprocessor, Cmelik et al, issued Feb. 29, 2000, and assigned to the assignee of the present application.

Because of its design, the new microprocessor utilizes many fewer circuit elements than do competitive processors. Consequently, it uses much less power than prior art processors to accomplish similar operations. An enhancement to this microprocessor further reduces its power dissipation and allows the microprocessor to run for significantly-extended periods using limited power sources such as batteries. This enhancement constantly monitors system operation and adjusts both the system voltage and operating frequency based on the requirements of the system as it operates. This enhancement is described in U.S. patent application Ser. No. 09/484,516, entitled Adaptive Power Control, S. Halepete et al, filed Jan. 18, 2000, and assigned to the assignee of the present invention. Because this power-conserving enhancement constantly varies frequency and voltage, the various propagation characteristics of the system which control the ability of the chip to meet interface specifications may also vary constantly.

It is therefore desirable to provide improved arrangements for controlling the characteristics of semiconductor chip circuitry based on attributes determined by monitoring the chip in operation.

SUMMARY OF THE INVENTION

The present invention is realized by apparatus comprising functional components of circuitry defined on a semiconductor chip, the functional components including a component having modifiable operating characteristics, a performance measuring circuit providing an output indicative of operating characteristics of the circuitry defined on the semiconductor chip during operation of the circuitry, and computer implemented software means for controlling a value for an operating characteristic of the component having modifiable operating characteristics in response to the output provided by the performance measuring circuit.

These and other features of the invention will be better understood by reference to the detailed description which follows taken together with the drawings in which like elements are referred to by like designations throughout the several views.

BRIEF DESCRIPTION OF THE DRAWINGS

Prior Art

DETAILED DESCRIPTION

Figure 1:
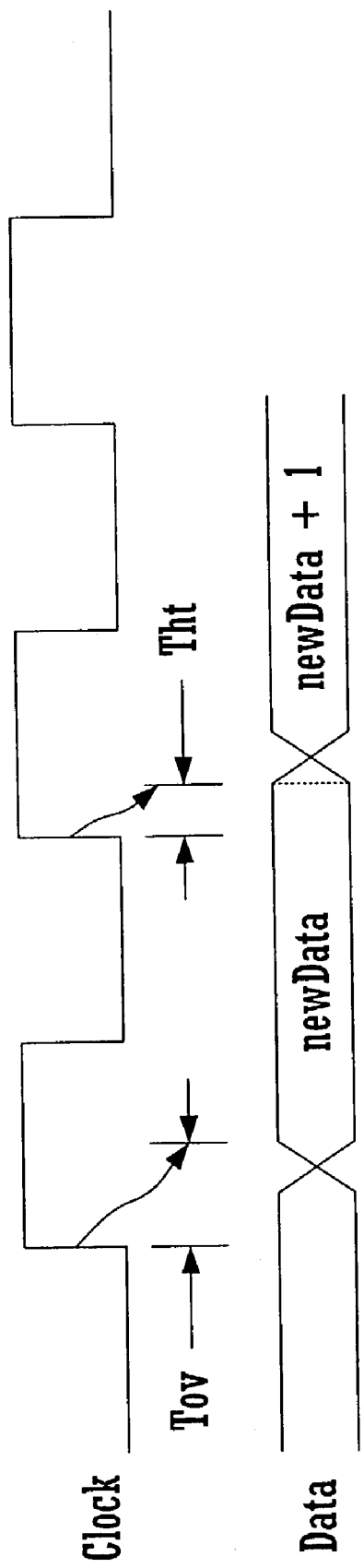
FIG. 1 is a timing diagram illustrating properties of circuitry which may vary depending on other circuitry connected in a system.
Figure 2:
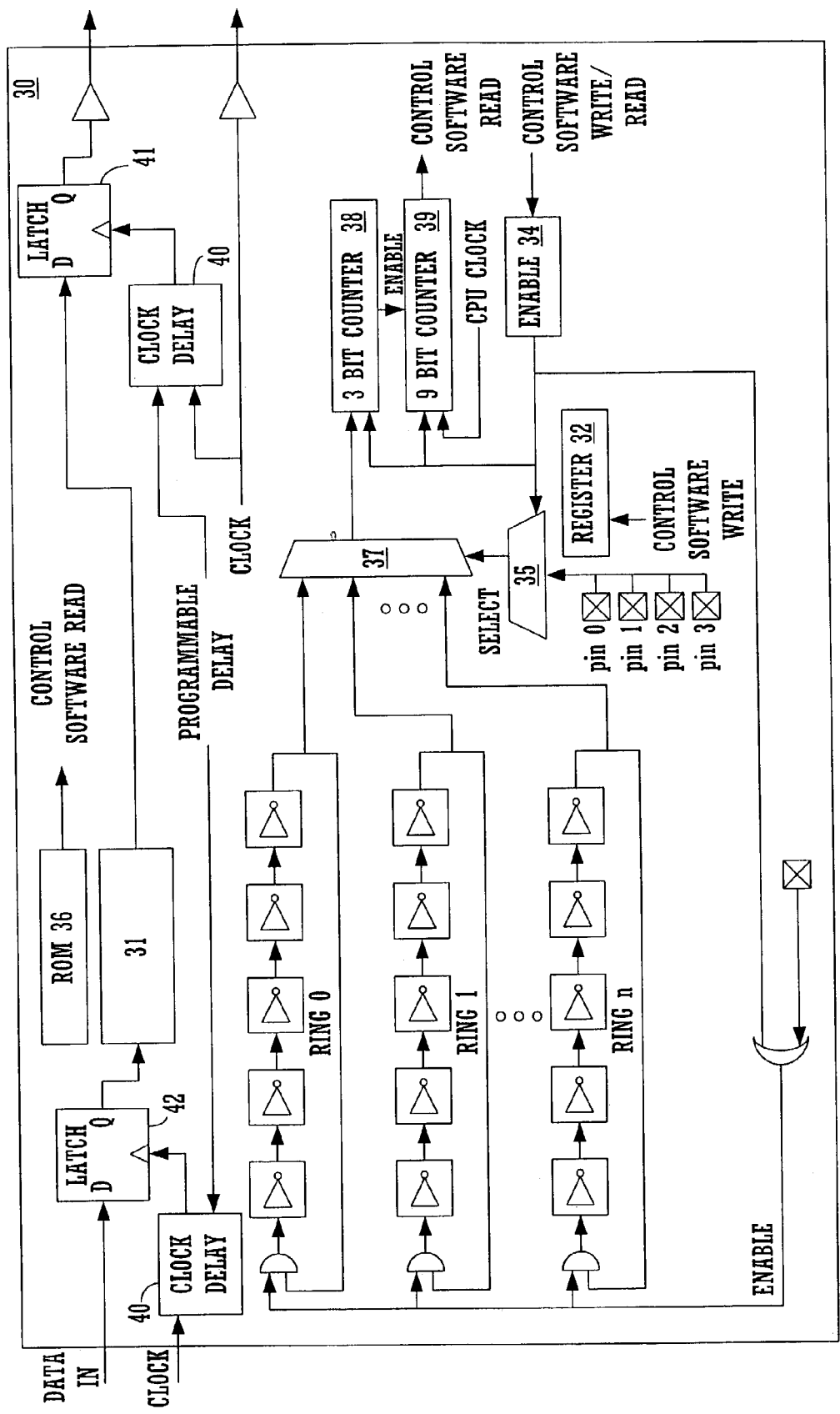
FIG. 2 is a block diagram of circuitry designed in accordance with the present invention.

Referring now to FIG. 2, there is illustrated an arrangement designed in accordance with the present invention for modifying circuit characteristics with changes in operating conditions and characteristics of the chip carrying the circuitry. Although the arrangement is described in the context of adjusting input/output characteristics, it has wide application to many other characteristics of operating circuits which change during operation or between parts and which may be monitored and modified as those characteristics change. It should be noted that the changing conditions and characteristics may be related to circuits being monitored and to circuitry connected in circuit through interfaces with the monitored circuitry.

The arrangement of FIG. 2 utilizes one or more ring oscillator circuits Ring0-RingN constructed as a portion of the circuitry of the semiconductor chip 30 which includes the circuitry 31 the characteristics of which are to be controlled.

A typical ring oscillator includes an odd-numbered plurality of inverter stages connected in series with the output of the last stage furnished as input to the first stage. A positive clock signal furnished at an input to a first inverter stage of any ring oscillator generates a negative clock signal at the output of the first inverter stage. Since the stages are connected in series, the input to each next stage is opposite in value to that of both the preceding and succeeding stage. With an odd number of stages, the signal resulting from the last stage is opposite to that originally furnished to the first inverter. By feeding the signal produced at the output of the last stage to the input of the first stage, a succession of alternating pulses may be produced at any node between stages. The pulses produced at a selected node of a ring oscillator are at a frequency which depends on the operating properties of the semiconductor chip, the voltage of operation, and the temperature of operation.

Ring oscillators are well known in the computer arts for testing purposes. It is typical for computer processors to include a number of ring oscillators for measuring the various characteristics of the circuitry to determine whether and how the circuitry fulfills design requirements. However, the results of such measurements have only been utilized to provide static values from which the operating characteristics of the circuitry may be estimated.

The present invention utilizes the output of a selected ring oscillator to determine various operating characteristics of the circuitry on the chip 30. The circuit of FIG. 2 includes circuitry for selecting from among the different ring oscillator circuits R0-RN. Selection is made on the basis of inputs provided at an input terminal to a multiplexor 37. In the particular arrangement illustrated, the values provided for selecting the particular ring oscillator may be determined in two ways. First, the ring oscillator may be determined from a tester or other external source which applied values on input terminals pin0-pin3. The signals applied to the various pins may be used to view operating characteristics of the circuitry on the chip 10.

However, in addition to the values provided at terminals pin0-pin3 which are essentially used for manufacturing tests, the invention allows selection of a particular ring oscillator by means of a value stored in a register 32. The particular mode of selection (i.e., terminals or register value) depends on an enabling signal furnished by control software to an enable register 34.

The values placed in the registers 32 and 34 are furnished by control software. The value in register 34 specifically determines whether the values on pin0-pin3 or the value in register 32 is used for selection of the ring oscillator to provide output.

In one particular embodiment, the controlling software utilizes the register 32 to select from outputs of one or more of the ring oscillators to determine characteristics of the circuitry 31 on the chip 30 during operation of the circuitry. Thus, the controlling software may provide a value to the register 32 which indicates that the output produced by ring0 is to be monitored. Alternatively, the value provided may indicate any of the other ring oscillators R1-RN. Typically, the different ring oscillators are constructed in such a manner that they provide indications measuring different characteristics of the semiconductor chip and the circuitry thereon. Thus, the output of a single oscillator may be sufficient to provide those characteristics necessary to determine an exact value for input/output characteristics or other characteristics of interest in controlling operating characteristics of the circuitry on the chip 30.

In addition to the values produced by the ring oscillators, other characteristics may be utilized by the controlling software. For example, operating specification for memory circuits from a plurality of different manufacturers may be stored in read only memory 36 for use by the controlling software. These values may be utilized by the controlling software to determine specifications which are to be met for values such as the output valid time and hold time described above.

In accordance with the present invention, the controlling software selects a particular one or more ring oscillators from which to read frequency-related output signals. It accomplishes this by providing a value to register 32 designating a particular ring oscillator R0-RN and furnishing an enable value to the register 34 indicating that the value in register 32 is to be used for the selection. This causes the value in register 32 to be furnished by a multiplexor 35 to the selection terminal of the multiplexor 37 so that the output of the desired ring oscillator may be read.

In one embodiment, the software selects output from the ring oscillator. The system clock remains constant so that the number of fast system clocks during an interval of two periods of output from the ring oscillator indicates the speed of operation of the circuitry on the silicon chip 30.

With knowledge of the speed of operation of the circuitry 31 on the chip 30 provided by the selected ring oscillator, the controlling software selects from the data stored in read-only memory the specifications for the particular interface the characteristics of which are being controlled.

Having these values, the controlling software selects a particular delay path to utilize in the output circuitry on the chip 30 to the interface involved.

In the particular embodiment illustrated in FIG. 2, the invention counts the number of fast processor clock pulses during two ring oscillator periods. It does this by furnishing the output of the ring oscillator to a counter circuit 38. The ring oscillators are enabled by the same signals which enable the selection of ring oscillator output and which initiate the generation of signals by the ring oscillator. Consequently, the counter 38 begin counting output signals produced by the oscillator selected.

In one embodiment, the counter is a three bit counter which generates a signal to enable a second counter 39 after a selected number of periods of ring oscillator output. When counter 39 is enabled, it begins to count system clock signals. The period during which the counter 39 continues to count is limited by the removal of the enabling signal produced by the counter 38 after a selected number of additional periods. In the described embodiment, the enable signals is produced for two periods of ring oscillator output. Thus, the result is to count the number of system clock signals which occur during a period controlled by the ring oscillator output. When the enable is removed, the result remains in the counter circuit 39 where it may be read by the controlling software.

The control software reads the value, applies an algorithm by which the speed of the chip and its consequent delays are determined, and selects an appropriate delay line for generating the output from the chip. This delay line may be utilized to produce output signals with the correct timing to meet the specifications of the associated chips in the system.

Figure 3:
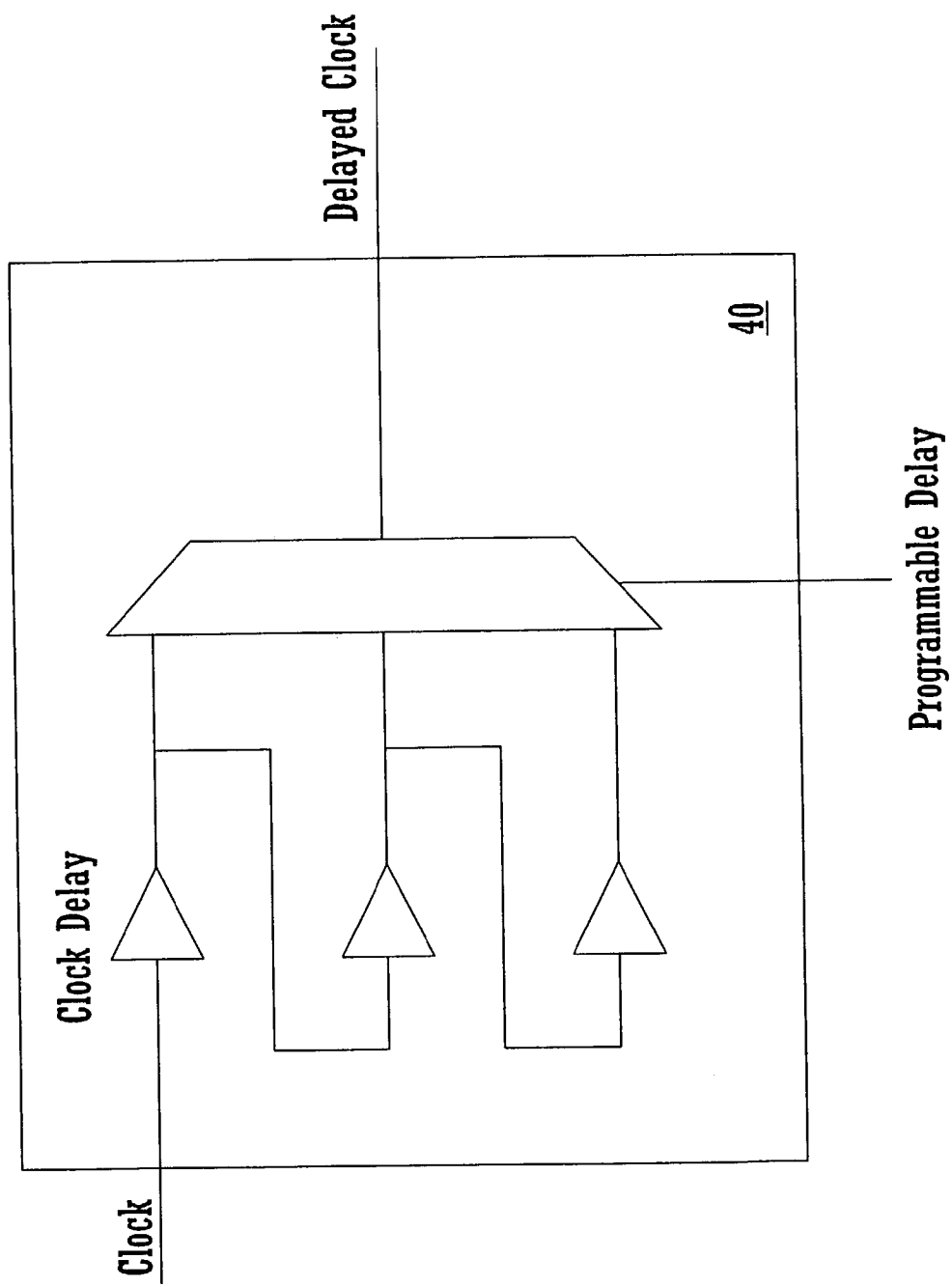
FIG. 3 is diagram illustrating a detail of the circuit of FIG. 2.

In one embodiment illustrated in FIG. 2, the control software selects the delay provided by an output latch by providing a programmable delay signal to a clock delay circuit 40. The clock delay circuit utilizes a selected delay path (FIG. 3 illustrated one simplified arrangement 40) to enable output from a latch 41 thereby controlling the duration of the hold time for data generated by the circuit 31 to meet the specification values computed by the control software. In a similar manner, the value is used by the control software to compute a programmable delay for controlling a second clock delay circuit 40 which controls the duration provided by a latch 42 transferring input data to the circuitry 31.

The present invention offers a number of advantages over prior art circuits. Because the control software has at hand in ROM 36 an essentially unlimited amount of data defining characteristics of other chips with which the chip 30 is to function, parameters of the chip 30, and may determine the changes in the characteristics of the circuitry 31 while that circuitry is operating, the control software may make very accurate and rapid changes in the input and output characteristics of the chip 30 to meet changing operating conditions.

The ability to select from a plurality of different ring oscillators adapted to provide outputs related to different properties also offers a number of advantages. For example, the different parameters available together with the broad measurements of operating characteristics available allow software solutions of advanced problems which have troubled computer designers. The invention can be used, for example, to manipulate cache timing parameters, to control phase delays, to generate external clocks, and for solutions to similar problems.

The embodiment of the invention described offers a number of advantages among which two are especially important. Without the invention, the range of operation of the chip is severely constrained by variations in chip processing, environmental conditions such as voltage and temperature, and specifications of other associated system components. This invention increases the range of operation and hence the manufacturing yield which may have significant financial effect. Additionally, it is beneficial to intentionally and dynamically vary the frequency of operation of the chip as well as the voltage of operation based on task requirements. This embodiment allows the output and input characteristics of the chip to be operated at the optimal point in concert with these dynamic changes.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An apparatus comprising:
    functional components of circuitry defined on a semiconductor chip that supply output signals from said semiconductor chip to another semiconductor chip that interfaces with said semiconductor chip, the functional components including a component that has modifiable operating characteristics that affect interface characteristics of the output signals, a performance measuring circuit providing an output indicative of operating characteristics of the functional components of circuitry defined on the semiconductor chip during operation of the functional components of circuitry wherein said performance measuring circuit comprises a plurality of ring oscillators, and computer implemented software means for controlling via a register a value provided to the component having modifiable operating characteristics that affect the interface characteristics of the output signals in response to an output provided by the performance measuring circuit, wherein said controlling a value comprises selecting clock delays that are managed so that the timing of data transfer made with respect to a clock signal is controlled wherein at least one of said plurality of ring oscillators is selected based on said value that is provided to said register from said computer-implemented software means.

2. A method for controlling the interface characteristics of output signals provided by functional components of circuitry having modifiable operating characteristics defined on a semiconductor chip comprising the steps of:

generating an output from the functional components of circuitry defined on the semiconductor chip that supply output signals from said semiconductor chip to another semiconductor chip that interfaces with said semiconductor chip during operation of the circuitry, and utilizing computer-implemented software that provides a value to a register, dynamically generating control signals for modifying the interface characteristics of the output signals provided by the functional components of circuitry having modifiable operating characteristics in response to the output from the functional components of circuitry, wherein said modifying comprises selecting clock delays that are managed so that the timing of data transfer made with respect to a clock signal is controlled and wherein said modifiable operating characteristics are measured utilizing at least one ring oscillator of a plurality of ring oscillators that is selected based on said value that is provided to said register by said computer-implemented software.

3. An apparatus comprising:

functional components of circuitry defined on a semiconductor chip that supply output signals from said semiconductor chip to another semiconductor chip that interfaces with said semiconductor chip, the functional components including a component having modifiable operating characteristics, a performance measuring circuit providing an output indicative of operating characteristics of the functional components of circuitry defined on the semiconductor chip during operation of the circuitry wherein said performance measuring circuit comprises a plurality of ring oscillators, and computer implemented software means for controlling via a register a value for an operating characteristic of the component having modifiable operating characteristics in response to the output provided by the performance measuring circuit, wherein said controlling a value comprises selecting clock delays that are managed so that the timing of data transfer made with respect to a clock signal is controlled wherein at least one of said plurality of ring oscillators is selected based on said value that is provided to said register from said computer-implemented software means.

4. A method for controlling the operating characteristics of functional components of circuitry having modifiable operating characteristics defined on a semiconductor chip comprising the steps of:

generating an output from the functional components of circuitry defined on the semiconductor chip that supply output signals from said semiconductor chip to another semiconductor chip that interfaces with said semiconductor chip during operation of the functional components of circuitry, and dynamically generating control signals for modifying the operating characteristics from the functional components of circuitry having modifiable operating characteristics in response to a signal which is generated utilizing computer-implemented software and provided via a register, wherein said modifying comprises selecting clock delays that are managed so that the timing of data transfer made with respect to a clock signal is controlled and wherein said modifiable operating characteristics are measured utilizing at least one ring oscillator of a plurality of ring oscillators that is selected based on said value that is provided to said register by said computer-implemented software.

5. An apparatus comprising:

functional circuit components that are defined on a semiconductor chip that supply output signals from said semiconductor chip to another semiconductor chip that interfaces with said semiconductor chip, said functional circuit components comprising a component having modifiable operating characteristics that affect interface characteristics of said output signals;

a performance measuring circuit which provides, during the operation of said functional circuit components, an output that corresponds to operating characteristics of said functional circuit components wherein said performance measuring circuit comprises a plurality of ring oscillators; and computer implemented software for controlling a value provided via a register to said component having modifiable operating characteristics, said value affecting said interface characteristics of said output signals in response to said output provided by said performance measuring circuit, wherein said controlling a value comprises selecting clock delays that are managed so that the timing of data transfer made with respect to a clock signal is controlled wherein at least one of said plurality of ring oscillators is selected based on said value that is provided to said register from said computer-implemented software means.

6. A method for controlling interface characteristics of output signals provided by functional circuit components defined on a semiconductor chip that have modifiable operating characteristics, comprising the steps of:

generating an output from said functional circuit components that are defined on said semiconductor chip said output supplied from said semiconductor chip to another semiconductor chip that interfaces with said semiconductor chip;

utilizing computer implemented software to dynamically generate via a register control signals, in response to said output of said functional circuit components defined on said semiconductor chip, for modifying said interface characteristics of output signals generated by said functional circuit components having modifiable operating characteristics, wherein said modifying comprises selecting clock delays that are managed so that the timing of data transfer made with respect to a clock signal is controlled and wherein said modifiable operating characteristics are measured utilizing at least one ring oscillator of a plurality of ring oscillators that is selected based on said value that is provided to said register by said computer-implemented software.

7. An apparatus comprising:

functional circuit components that are defined on a semiconductor chip said functional circuit components generating an output that is supplied from said semiconductor chip to another semiconductor chip that interfaces with said semiconductor chip and comprising a component having modifiable operating characteristics;

a performance measuring circuit which provides an output that corresponds to operating characteristics of said functional circuit components that reside on said semiconductor chip during the operation of said functional circuit components wherein said performance measuring circuit comprises a plurality of ring oscillators; and computer implemented software for controlling via a register a value for an operating characteristic of said component having modifiable operating characteristics in response to said output provided by said performance measuring circuit, wherein said controlling a value comprises selecting clock delays that are managed so that the timing of data transfer made with respect to a clock signal is controlled wherein at least one of said plurality of ring oscillators is selected based on said value that is provided to said register from said computer-implemented software means.

8. A method for controlling operating characteristics of functional circuit components that have modifiable operating characteristics and are defined on a semiconductor chip, comprising the steps of:

generating an output from said functional circuit components that is supplied from said semiconductor chip to another semiconductor chip that interfaces with said semiconductor chip and that is related to said modifiable operating characteristics; and utilizing software to dynamically generate via a register control signals, in response to an output corresponding to said operating characteristics, for modifying said operating characteristics of said functional circuit components that have modifiable operating characteristics, wherein said modifying comprises selecting clock delays that are managed so that the timing of data transfer made with respect to a clock signal is controlled and wherein said modifiable operating characteristics are measured utilizing at least one ring oscillator of a plurality of ring oscillators that is selected based on said value that is provided to said register by said software.

* * * * *